United States Patent [19]
Kobayashi et al.

[11] Patent Number: 5,081,052
[45] Date of Patent: Jan. 14, 1992

[54] ROM AND PROCESS FOR PRODUCING THE SAME

[75] Inventors: Isamu Kobayashi, Tokyo; Ryuuji Shibata, Higashiyamato, both of Japan

[73] Assignee: Hitachi, Ltd., Tokyo, Japan

[21] Appl. No.: 373,620

[22] Filed: Jun. 28, 1989

Related U.S. Application Data

[63] Continuation of Ser. No. 66,206, Jun. 25, 1987, abandoned.

[30] Foreign Application Priority Data

Jun. 25, 1986 [JP] Japan .................. 61-146888

[51] Int. Cl.$^5$ ........................................ H01L 21/265
[52] U.S. Cl. .................................. 437/29; 437/44; 437/45; 357/23.12
[58] Field of Search ............... 437/45, 30, 29, 44, 437/48

[56] References Cited

U.S. PATENT DOCUMENTS

| | | | |
|---|---|---|---|
| 4,198,693 | 4/1980 | Kuo | 437/52 |
| 4,268,950 | 5/1981 | Chatterjee et al. | 437/45 |
| 4,359,817 | 11/1982 | Dickman et al. | 437/52 |
| 4,364,165 | 12/1982 | Dickman et al. | 437/52 |
| 4,364,167 | 12/1982 | Donley | 437/52 |
| 4,633,572 | 1/1987 | Rusch et al. | 437/45 |
| 4,649,629 | 3/1987 | Miller et al. | 437/45 |
| 4,745,083 | 5/1988 | Huie | 437/45 |
| 4,782,033 | 11/1988 | Gierisch et al. | 437/56 |

FOREIGN PATENT DOCUMENTS

| | | | |
|---|---|---|---|
| 0073130 | 3/1983 | European Pat. Off. | 437/45 |
| 0083088 | 7/1983 | European Pat. Off. | 437/45 |
| 52-30388 | 3/1977 | Japan . | |
| 56-87368 | 7/1981 | Japan | 437/45 |
| 58-56470 | 4/1983 | Japan | 437/45 |

OTHER PUBLICATIONS

Tsang, P., et al, "Fabrication of High Performance LDDFET's with Oxide Sidewall-Spacer Technology", *IEEE Transactions on Electron Devices*, vol. ED-29, No. 4, 4/82.

Primary Examiner—Brian E. Hearn
Assistant Examiner—G. Fourson
Attorney, Agent, or Firm—Antonelli, Terry, Stout & Kraus

[57] ABSTRACT

MISFET's are formed in the depletion mode in advance in a process comprising blanket implantation of the region in which memory cells are to be formed. MISFET's which are selected from these depletion-mode MISFET's are then formed into enhancement-mode or weak depletion-mode MISFET's to thereby write desired data into the memory cells of a read-only memory. The change of the MISFET's from the depletion mode into the enhancement mode (or weak depletion mode) is effected by introducing an impurity into the channel regions of the selected MISFET's in a manufacturing step that is carried out after the formation of the gate electrodes of the MISFET's.

29 Claims, 4 Drawing Sheets

ROM AND PROCESS FOR PRODUCING THE SAME

This application is a continuation of application Ser. No. 066,206, filed June 25, 1987, now abandoned.

BACKGROUND OF THE INVENTION

The present invention relates to a process for producing a semiconductor integrated circuit device. More particularly, the present invention pertains to a technique which may effectively be applied to writing of data into memory cells in a mask-programmed ROM (Read Only Memory).

In mask-programmed ROM's, each memory cell is generally formed using a MISFET, and writing of data into this memory cell is effected by controlling the threshold voltage of the MISFET.

As one type of such mask-programmed ROM, vertical ROM's are known (see, for example, the specification of Japanese Patent Laid-Open No. 30388/1977). In such a vertical ROM, memory cells which are constituted by MISFET's are provided at the intersections, respectively, between data and word lines. A plurality of such memory cells are connected in series to form a row of memory cells, and a plurality of such memory cell rows are arranged to form a memory cell array.

SUMMARY OF THE INVENTION

The present inventors examined the above-described method of writing data into the memory cells of a vertical ROM. The following is a brief summary of a technique examined by the present inventors, although it is not a known technique.

Writing of data into memory cells of a vertical ROM is effected by carrying out the following steps. For example, after the formation of a gate insulator film, channel doping is effected using boron to form all MISFET's which constitute memory cells in the enhancement mode in advance. Then, phosphorus is doped into the channel regions of selected ones of the enhancement-mode MISFET's so as to form the selected MISFET's into depletion-mode MISFET's, thus writing of data being effected. In this case, for example, the enhancement-mode MISFET's correspond to data "1", while the depletion-mode MISFET's correspond to data "0".

The above-described data writing method suffers, however, from the following problems. Since the step of writing data by means of channel doping using phosphorus is carried out at a relatively early stage in the process for producing a vertical ROM, an unfavorably long time is required to complete a vertical ROM having desired data written therein, that is, the turn around time is disadvantageously long.

It would be possible to reduce the turn around time, if the channel doping of phosphorus could be effected after the formation of an Al wiring on an intermediate insulator film such as phosphosilicate glass (PSG) film. However, since the mass of phosphorus is relatively large (the mass number: 31), it is difficult to effect channel doping of phosphorus through the intermediate insulator film with a practical ion implantation energy.

Further, if writing of data into the memory cells of the vertical ROM is effected in such a manner that MISFET's which constitute the memory cells are first formed in the enhancement mode and selected ones of the MISFET's are then formed into depletion-mode MISFET's in accordance with data to be written by means of channel doping using phosphorus (P), there is a fear of the phosphorus (P) being introduced into a part of the channel of a MISFET which should be left in the enhancement mode due to, for example, misalignment of a mask used when channel doping of phosphorus (P) is effected, which would lead to an error in data.

Further, if channel doping is carried out after the source and drain regions of the MISFET's have been formed, since the channel doping is effected with a high energy and at a high concentration, the phosphorus (P) is doped deeply at the bird's beak portion of the field insulator film (LOCOS oxide film), and this may lead to punchthrough between data lines in memory cells which are adjacent to each other.

It is an object of the present invention to provide a technique which enables a reduction in the turn around time of a ROM including memory cells which have desired data written therein.

It is another object of the present invention to improve the reliability in writing data into a ROM.

The above and other objects and novel features of the present invention will become clear from the following description of the preferred embodiment thereof, taken in conjunction with the accompanying drawings.

A representative one of the novel techniques disclosed in this application will be summarized as follows.

All MISFET's which constitute memory cells are formed in the depletion mode in advance, and an impurity which has a smaller mass than that of phosphorus is then introduced by means of channel doping into the channels of selected ones of the depletion-mode MISFET's to form the doped MISFET's into enhancement-mode MISFET's or into weak depletion-mode MISFET's, thereby writing data into the memory cells.

By virtue of the above-described means, since an impurity which has a relatively small mass has a relatively high penetrating power, it is possible to carry out channel doping through an intermediate insulator film before or after the formation of wiring, so that depletion-mode MISFET's are formed into enhancement-mode MISFET's or into weak depletion-mode MISFET's and writing of data is thus effected. Accordingly, it is possible to reduce the turn around time of a ROM including memory cells which have desired data written therein.

Since all MISFET's which constitute memory cells are formed in the depletion mode in advance and selected ones of the depletion-mode MISFET's are then formed into enhancement-mode MISFET's or into weak depletion-mode MISFET's by means of channel doping of an impurity, an error in data can hardly occur even if the impurity is introduced into a part of the channel of a MISFET which should be left in the depletion mode, provided that the impurity is not introduced into the greater part of the channel.

Further, the formation of depletion-mode MISFET's into enhancement-mode MISFET's by the channel doping enables the channel of each enhancement-mode MISFET to also serve as a channel stopper between data lines which are adjacent to each other.

Another feature of the present invention resides in the advantage that the threshold voltage Vth of MISFET's (EEMOS's) which are formed into enhancement-mode devices by means of channel doping of boron ($B^{++}$) has less short channel effect than that of an active NMOS as shown in FIG. 8 and it is therefore possible to positively utilize the short channel region for miniaturization of memory cells.

For the above-described reasons, it is possible to improve the reliability in writing of data into a ROM and increase the margin in designing of devices.

DESCRIPTION OF THE PREFERRED EMBODIMENT

Figure 1:
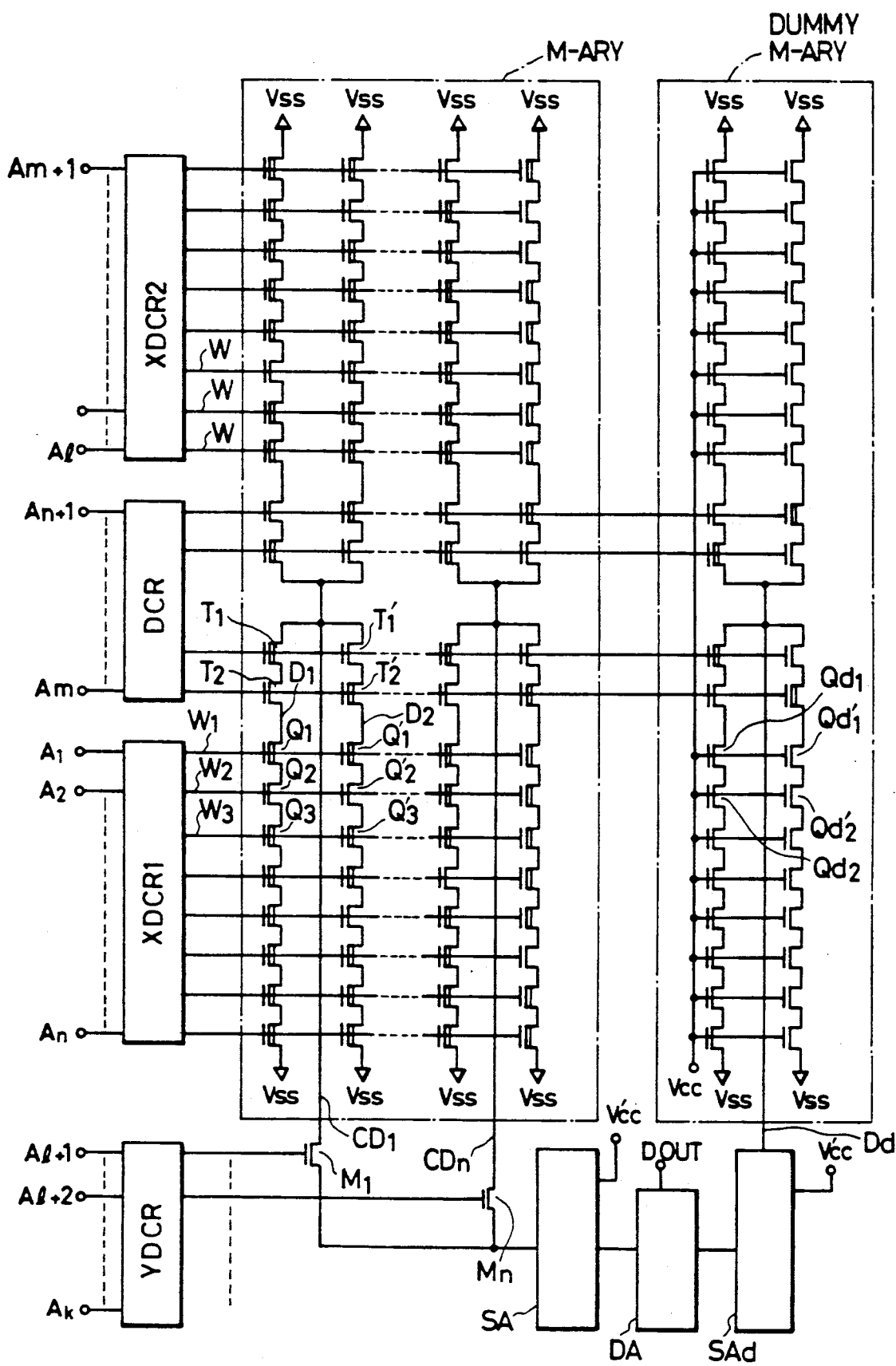
FIG. 1 is a circuit diagram of a vertical ROM in accordance with one embodiment of the present invention.

The arrangement of the present invention will be described hereinunder by way of one embodiment and with reference to the accompanying drawings.

It should be noted that, throughout the drawings, members or portions having the same functions are denoted by the same reference numerals and repetitive description thereof is omitted.

FIG. 1 is a circuit diagram showing the circuit configuration of a vertical ROM in accordance with one embodiment of the present invention.

Referring to FIG. 1, the vertical ROM in accordance with this embodiment is provided with row address decoders XDCR 1, 2, a decoder DCR and a column address decoder YDCR. A multiplicity of word lines $W_1, W_2 \ldots$ are connected to the row address decoders XDCR 1, 2. Among the word lines $W_1, W_2 \ldots$, one word line is brought to a low level (L) and the other word lines are brought to a high level (H) by the operation of the row address decoders XDCR 1, 2 on the basis of address signals $A_l$ to $A_n$. The decoder DCR is connected to the gates of MISFET's $T_1, T'_1, T_2, T'_2$ which are provided for a multiplicity of data lines $D_1, D_2 \ldots$ Any one of the pairs of MISFET's $T_1, T_2, \ldots$ are brought to an ON state on the basis of address signals $A_{n+1}$ to $A_m$ to thereby select one of the data lines $D_1, D_2 \ldots$, and the selected data line is thus coupled to a common data line CD. It should be noted that one end of each of the data lines D, $D_2 \ldots$ is set at a ground potential $V_{ss}$.

MISFET's $Q_1, Q_2, Q_3, Q'_1, Q'_2, Q'_3 \ldots$ which constitute memory cells are respectively provided at the intersections between the word lines $W_1, W_2 \ldots$ and the data lines $D_1, D_2 \ldots$, and these memory cells constituted by the MISFET's form in combination a memory cell array M-ARY. In this memory cell array M-ARY, a plurality of MISFET's having their respective gates are coupled to different word lines are connected in series to each data line. Thus, a row of MISFET's is arranged for each data line. A memory all from which data is to be read is selected by the operation of the row address decoders XDCR 1, 2 and the decoder DCR, and a signal corresponding to the read data is output through the common data line CD. Although one memory cell array M-ARY alone is illustrated in FIG. 1, the vertical ROM in accordance with this embodiment is actually provided with a plurality of memory cell arrays M-ARY.

All the MISFET's constituting the above-described memory cell array M-ARY are first formed in the depletion mode (corresponding to, for example, the data "0") by means of channel doping effected by ion implantation of, for example, phosphorus, as described later. Then, channel doping is effected by ion-implanting, for example, boron, into the channel regions of depletion-mode MISFET's which correspond to memory cell into which the data "1" is to be written through an intermediate insulator film before or after the formation of Al wiring (described later), or without passing through an intermediate insulator film after the formation of source and drain regions, in order to form these MISFET's into enhancement-mode MISFET's or into weak depletion-mode MISFET's (the absolute value of the threshold voltage being relatively small), and desired data is thus written into the ROM. In this way, it is possible to reduce the turn around time of a vertical ROM having desired data written therein as described later.

Outputs from the common data lines $CD_l$ to $CD_m$ are input to a sense amplifier SA through column switch MISFET's $M_l$ to $M_n$, respectively. The respective gate electrodes of the column switch MISFET's $M_l$ to $M_n$ are coupled to the column decoder YDCR, so that one of these column switch MISFET's is selected by the operation of the column decoder YDCR on the basis of signals $A_{l+1}$ to $A_k$. In this case, a dummy data line Dd is additionally provided in order to obtain a reference for the sense amplifier SA. A plurality of MISFET's $Qd_1, Qd_2 \ldots$ which are all, for example, enhancement-mode MISFET's, are connected in series to this dummy data line Dd. One end of the dummy data line Dd is set at a ground potential $V_{ss}$, while the other end is connected to a sense amplifier SAd having the same arrangement as that of the above-described sense amplifier SA, so that the output from the dummy data line Dd is supplied to the sense amplifier SAd. The output of the sense amplifier SA and the output of the sense amplifier SAd are compared with each other in, for example, a one- or two-stage differential amplifier DA. The output $D_{out}$ of this differential amplifier DA is the final result of reading of data from a selected memory cell.

Since the above-described MISFET's which are formed into enhancement-mode MISFET's or weak depletion-mode MISFET's from depletion-mode MISFET's in the memory cell array M-ARY cannot cut off the path of a direct current as in the case of complete enhancement-mode MISFET's, it is preferable to lower the power supply potential $V'_{cc}$ of the common data line CD to the ground potential $V_{ss}$ when the ROM is in a stand-by state for the purpose of reducing the power dissipation. More specifically, when the ROM is in a stand-by state, the DC path of the sense amplifier and the differential amplifier is preferably cut off in response to a CE signal (Chip Enable signal). Thus, the current consumed when the device is in a standby state is decreased, and the power dissipation can be reduced.

The following is a description of a method of writing data into the memory cells of the vertical ROM in accordance with this embodiment.

Figure 2:
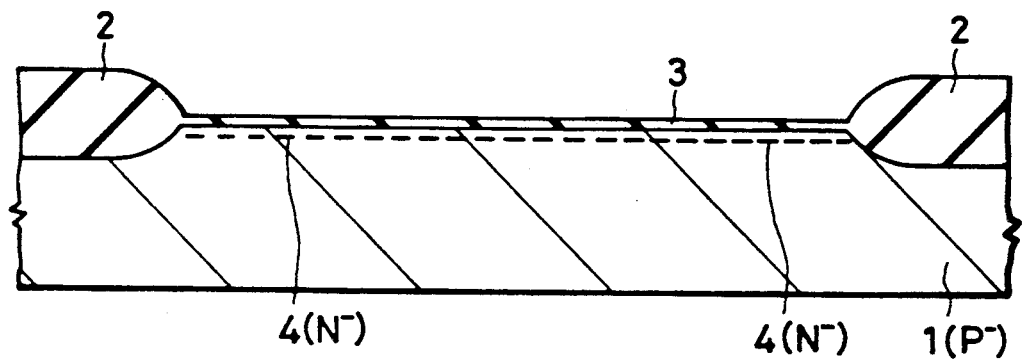
FIGS. 2 to 5 are sectional views which are employed to describe a method of writing data into memory cells of the vertical ROM shown in FIG. 1 in order of the manufacturing steps.

Referring first to FIG. 2, the surface of a semiconductor substrate 1, for example, a P-type Si substrate, is selectively thermally oxidized to form a field oxide film 2 defined by, for example, an $SiO_2$ film, in order to isolate adjacent elements from each other. Thereafter, the surface of an active region surrounded with this field insulator film 2 is thermally oxidized to form a gate insulator film 3 defined by, for example, an $SiO_2$ film. Then, channel doping is effect by ion-implanting, for example, arsenic (As) into the whole surface of the active region of the semiconductor substrate 1 through the gate insulator film 3, thereby forming an $N^-$-type impurity layer 4, and thus writing the data "1" into all the memory cells of the memory cell array M-ARY. It should be noted that this ion implantation is carried out at an implantation energy of, for example, 100 keV, and at a dose of, for example, $2.4 \times 10^{12}$ atoms/$cm^2$.

Figure 3:
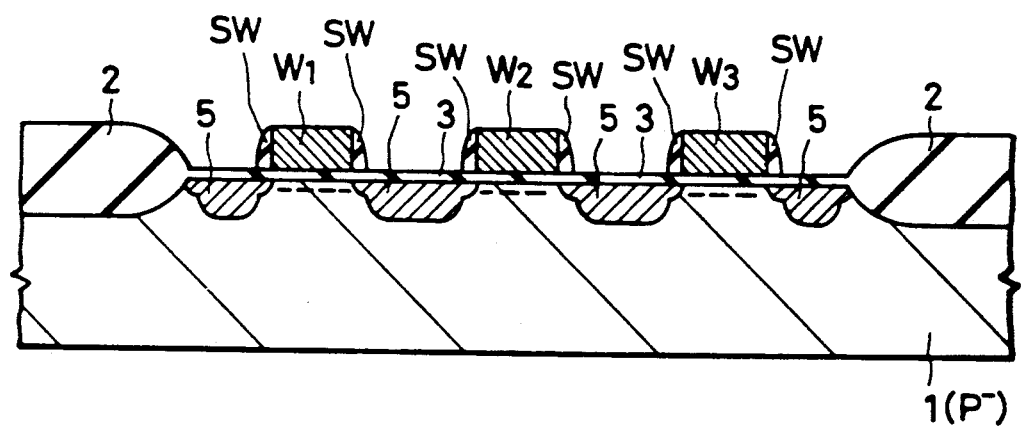
Figure 4:
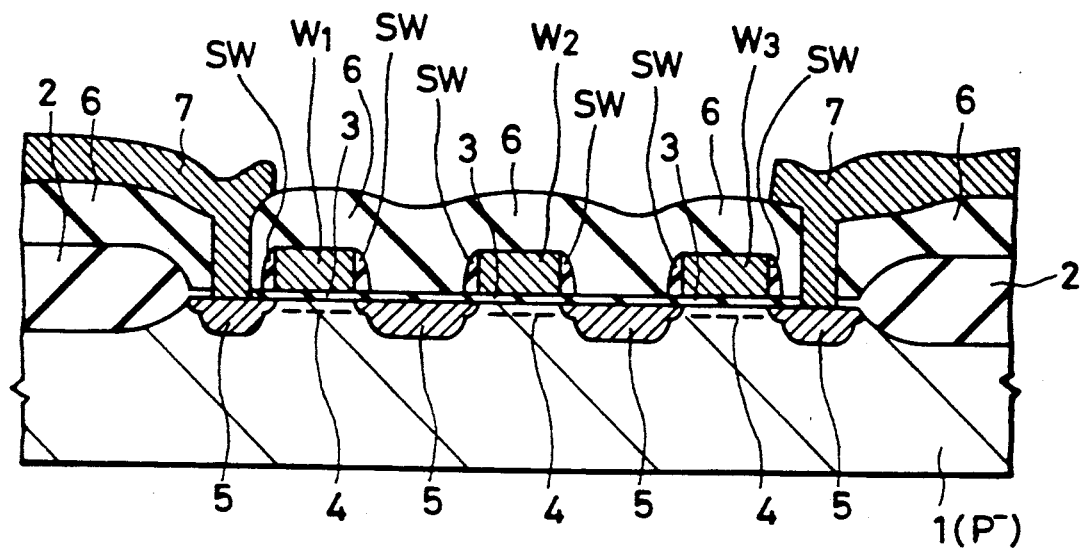
Figure 6:
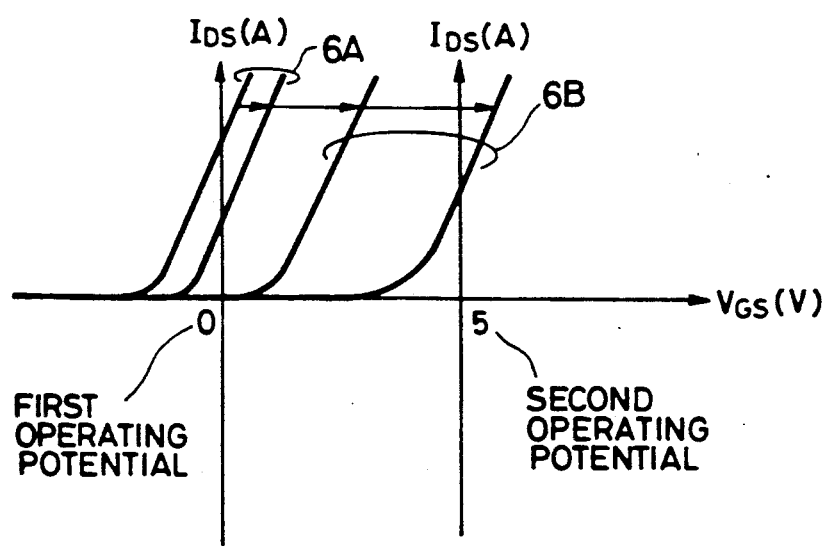
FIG. 6 is a graph showing the characteristics of a MISFET employed to constitute the ROM according to the present invention.

Referring next to FIG. 3, after, for example, a polycrystalline Si film has been formed all over the surface by, for example, the CVD (Chemical Vapor Deposition) method, this polycrystalline Si film is patterned in a predetermined configuration so as to dorm word lines $W_1$, $W_2$, $W_3$ which constitute gate electrodes. With these word lines $W_1$, $W_2$, $W_3$ used as masks, an n-type impurity, for example, phosphorus (P), is ion-implanted into the semiconductor substrate 1, and an $SiO_2$ film is formed all over the surface of the semiconductor substrate 1 by, for example, the CVD method. Thereafter, RIE (Reactive Ion Etching) is carried out in order to form side walls SW at the sides of the word lines. Further, with the side walls SW used as masks, an N-type impurity, for example, arsenic (As), is doped into the surface of the semiconductor substrate 1 to thereby form, for example $N^+$-type semiconductor regions 5 which define source and drain regions of MISFET's. The semiconductor regions 5 defining the source and drain regions include $N^+$-type regions and $N^-$-type regions which form in combination a so-called LDD (Lightly Doped Drain) structure. Thus, MISFET's which are respectively composed of the gate electrodes $W_1$, $W_2$, $W_3$ and the $N^+$-type semiconductor regions 5 are formed. All of the MISFET's are depletion-mode MISFET's because of the channel doping of arsenic (As). The depletion-mode MISFET's show characteristics such as those shown in FIG. 6. More specifically, the transistors turn ON at a first operating potential (0 V) as shown by the curves 6A in FIG. 6. In the graph shown in FIG. 6, $V_{GS}$ represents the gate-source voltage, and $I_{DS}$ the drain current. Although only three MISFET's $Q_1$, $Q_2$, $Q_3$ are illustrated herein as representatives of the MISFET's constituting the memory cells, a large number of MISFET's are actually arranged in a matrix.

Next, an intermediate insulator film 6 such as a PSG film is formed all over the surface by, for example, CVD. Predetermined portions of this intermediate insulator film 6 are removed by etching in order to form predetermined contact holes. Thereafter, for example, an Al film is formed all over the surface by sputtering or evaporation, and this Al film is then patterned in a predetermined configuration to thereby form data lines 7 formed from, for example, Al films, the data lines 7 being connected to the corresponding semiconductor regions 5 through the above-described contact holes.

Figure 5:
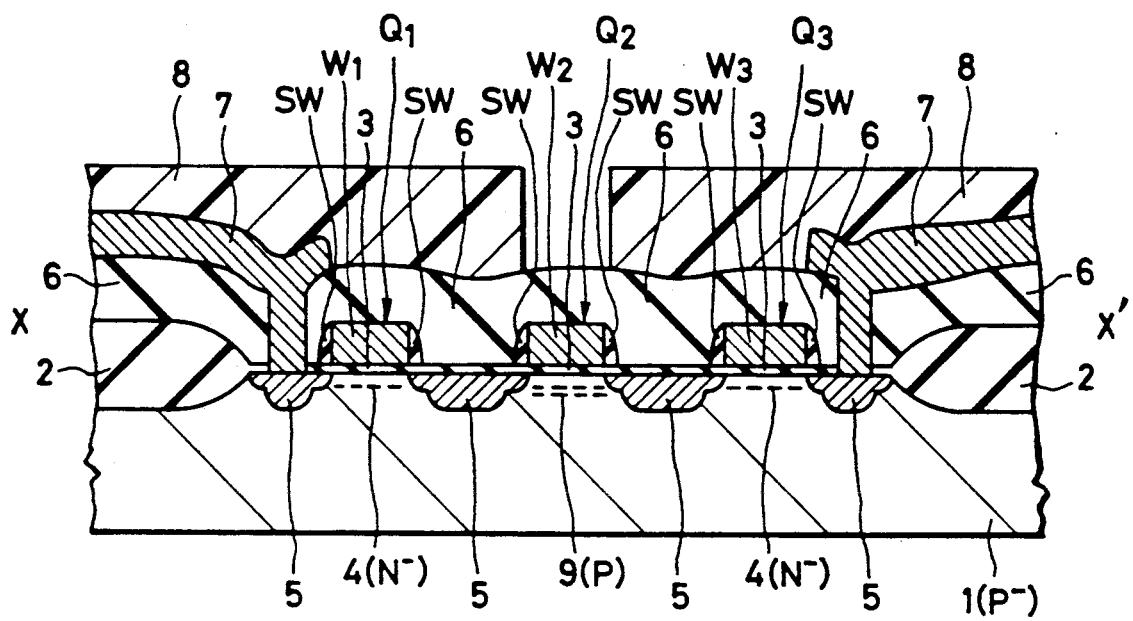
Figure 7:
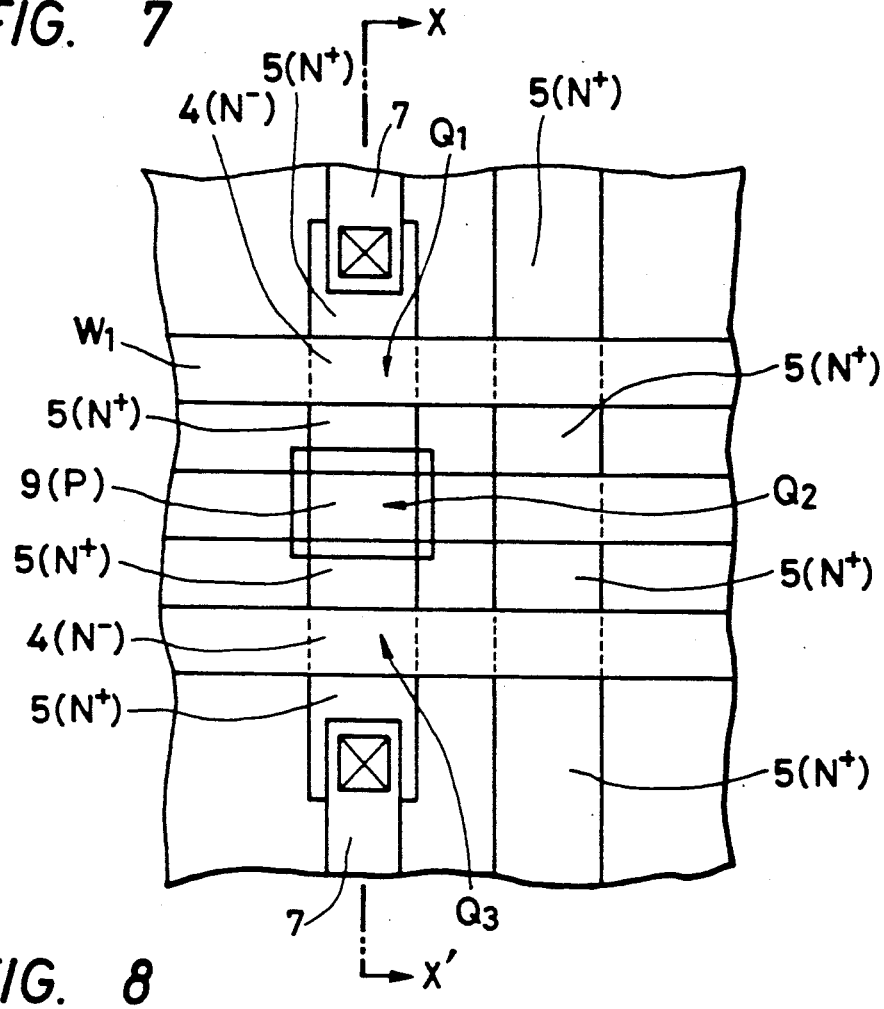
FIG. 7 is a plan view of a memory cell, which corresponds to FIG. 5.
Figure 8:
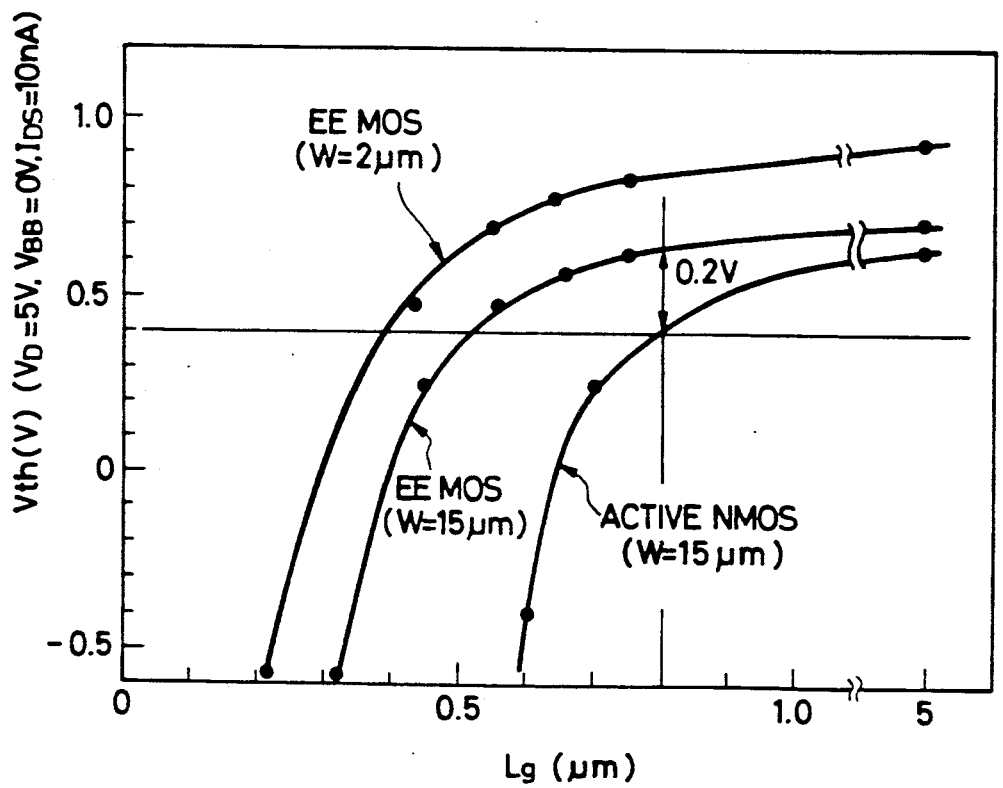
FIG. 8 is a graph showing the gate length (Lg) - threshold voltage (Vth) characteristics of MISFET's employed to constitute the ROM according to the present invention.

Referring next to FIG. 5, a photoresist 8 is formed on the surface of the intermediate insulator film 6, the photoresist 8 being open at portions thereof that correspond to MISFET's constituting memory cells into which, for example, the data "1", is to be written, e.g., the MISFET $Q_2$. Thereafter, with this photoresist 8 used as a mask, a P-type impurity having a smaller mass than that of phosphorus, for example, boron, is ion-implanted through the intermediate insulator film 6, the gate electrode $W_2$ and the gate insulator film 3 at an implantation energy of, for example, 180 keV, and at a dose of, for example, $1 \times 10^{13}$ atoms/$cm^2$, in order to effect channel doping with respect to the channel region of the MISFET $Q_2$, thereby negating the N type of phosphorus (P) which is an impurity in the $N^-$-type impurity layer 4 introduced into the channel region of the MISFET $Q_2$, and thus forming the MISFET $Q_2$ into an enhancement-mode MISFET or a weak depletion-mode MISFET. As a result, a P-type impurity layer 9 is formed, and writing, for example, the data "1" is thus effected. The enhancement-mode MISFET $Q_2$ thus formed shows characteristics such as those shown in FIG. 6. More specifically, the threshold value of the MISFET $Q_2$ has so changed that the MISFET $Q_2$ does not operate at the first operating potential (0 V) but operates at the second operating potential (5 V). Even if the P-type impurity is introduced into, for example, the channel of the MISFET $Q_1$ due to misalignment of the mask or the like, there is no effect on the depletion characteristics of the MISFET $Q_1$, provided that the impurity is introduced only into a part of the channel region. FIG. 7 is a plan view that corresponds to FIG. 5, which shows a memory cell array in the present invention. In the figure, the MISFET's $Q_1$ and $Q_3$ are formed in the depletion mode, while the MISFET $Q_2$ is formed in the enhancement mode of in the weak depletion mode, and these MISFET's are connected in series. Thus, since writing of data can be carried out after the formation of the Al wiring 7 which is the final step in the process for producing the vertical ROM, it is possible to reduce the turn around time and improve the reliability of the ROM. It should be noted that ion implantation of boron for writing data may also be carried out immediately after the formation of the intermediate insulator film 6 or after the formation of the source and drain regions.

Although the invention accomplished by the present inventors has practically been described by way of one embodiment, it should be noted here that the present invention is not necessarily limited to the described embodiment and various changes and modifications may, of course, be imparted thereto without departing from the gist of the invention.

For example, the present invention may be applied to a variety of types of semiconductor integrated circuit, such as a one-chip microcomputer having a vertical ROM. Further, the present invention may also be applied to a vertical ROM consisting of MISFET's having gate electrodes formed from not only polycrystalline Si but also, for example, a silicide or a polycide.

What is claimed is:

1. A process for producing a read-only memory having a plurality of memory cells which include n-channel MISFET's and which are connected in series to form rows of memory cells, said process comprising the steps of:

(1) preparing a semiconductor substrate having a principal surface, at least the principal surface, of said substrate, having a first conductivity type, the principal surface of the substrate having a field insulator film thereon, said field insulator film defining a region in which memory cells are to be formed;

(2) introducing an impurity of a second conductivity type into all of said principal surface in the region in which memory cells are to be formed, whereby the whole surface of the region in which memory cells are to be formed has the impurity of second conductivity type introduced therein;

(3) after said introducing an impurity of the second conductivity type, forming a plurality of MISFET's of the second conductivity type in said region, said plurality of MISFET's having gate electrodes; and (4) introducing an impurity of the first conductivity type into the channel region of at least one MISFET selected from said plurality of MISFET's, through the respective gate electrode of the selected at least one MISFET, said impurity of the first conductivity type having a smaller mass than that of phosphorus, wherein said first conductivity type is the P-type, and said second conductivity type is the N-type.

2. A process according to claim 1, wherein said step (4) is carried out in order to raise the threshold voltage of said selected MISFET higher than the threshold voltage of the other MISFET's.

3. A process according to claim 1, wherein the impurity which is introduced in said step (2) is arsenic and is implanted at an implantation energy of about 100 keV and at a dose of about $2.4 \times 10^{12}$ atoms/cm$^2$.

4. A process according to claim 1, wherein the impurity which is introduced in said step (4) is boron and is implanted at an implantation energy of about 180 keV.

5. A process according to claim 1, further comprising the step of:

(5) forming, after said step (3), an insulator film which covers the gate electrodes of said plurality of MISFET's.

6. A process according to claim 1, wherein the introduction of the impurity of the second conductivity type in said step (2) is carried out in order to form all the MISFET's constituting said memory cells into depletion-mode MISFET's, and the introduction of the impurity of the first conductivity type in said step (4) is carried out in order to form some of the depletion mode MISFET's formed in said step (2) into enhancement-mode MISFET's.

7. A process according to claim 1, wherein the impurity of the second conductivity type introduced in step (2) is arsenic.

8. A process according to claim 1, wherein the plurality of MISFET's formed in step (3) are depletion-mode MISFET's, and the impurity of the first conductivity type introduced into the channel of at least one MISFET is introduced so as to form the depletion-mode MISFET's into weak depletion-mode MISFET's.

9. A process according to claim 1, wherein the read-only memory produced is a vertical read-only memory.

10. A process according to claim 1, wherein, after forming the plurality of MISFET's, an aluminum wiring layer is provided thereover, and wherein the introduction of the impurity of the first conductivity type is performed through the aluminum wiring layer.

11. A process according to claim 10, wherein the aluminum wiring layer forms the data line of the read-only memory.

12. A process according to claim 1, wherein the gate electrodes of the plurality of MISFET's are made of polycide.

13. A process according to claim 12, wherein said step (4) is performed such that the selected at least one MISFET operates at a second operating potential of about 5 volts.

14. A process according to claim 13, wherein said step (4) is performed such that the selected at least one MISFET does not operate at a first operating potential of about zero volts.

15. A process according to claim 14, wherein said step (2) is performed such that said plurality of MISFET's operate at a first operating potential of about zero volts.

16. A process according to claim 15, wherein said field insulator film is comprised of a silicon oxide film which has a greater film thickness than that of a gate insulating film of said MISFET's.

17. A process according to claim 16, wherein said impurity of the first conductivity type is boron.

18. A process according to claim 1, wherein said impurity of the first conductivity type is introduced into the channel region of the selected at least one MISFET, in step (4), so as to write data into the memory cells.

19. A process according to claim 13, wherein said impurity of a second conductivity type is introduced, in step (2), prior to forming the gate electrode of the plurality of MISFET's.

20. A process for producing a read-only memory having a plurality of memory cells which include n-channel MISFET's and which are connected in series to form rows of memory cells, said process comprising the steps of:

(1) preparing a semiconductor substrate having a principal surface, at least the principal surface of said substrate having a first conductivity type, the principal surface of the substrate having a field insulator film thereon, said field insulator film defining a region in which memory cells are to be formed;

(2) introducing an impurity of a second conductivity type into all of the region of said principal surface in which memory cells are to be formed, whereby the whole surface of the region in which memory cells are to be formed has the impurity of second conductivity type introduced therein, in order to form n-channel MISFET's constituting said memory cells into depletion-mode MISFET's;

(3) after said introducing the impurity of the second conductivity type, forming a plurality of gate electrodes of said n-channel MISFET's overlying said region, on a gate insulating film, said gate electrodes having predetermined gaps between each other;

(4) introducing an impurity of the second conductivity type into said principal surface at said predetermined gaps selectively so as to form source and drain regions of the n-channel MISFET's; and (5) introducing an impurity of the first conductivity type through said gate electrodes into a channel region of at least one MISFET selected from said plurality of n-channel MISFET's constituting said memory cells, so that the selected at least one MISFET changes from a depletion-mode MISFET to an enhancement-mode MISFET, said impurity of the first conductivity type having a smaller mass than that of phosphorus, wherein said first conductivity type if P-type, and said second conductivity type is N-type.

21. A process according to claim 20, wherein the impurity which is introduced in said step (2) is arsenic.

22. A process according to claim 20, wherein the impurity which is introduced in said step (5) is boron, wherein both the introduction of the impurity of first conductivity type, and the introduction of the impurity of the second conductivity type in step (2), are by implantation, and wherein the impurity introduced in said step (5) is implanted at a higher implantation energy than that of the impurity introduced in said step (2).

23. A process according to claim 22, wherein the impurity which is introduced in said step (2) is arsenic.

24. A process according to claim 20, wherein the introduction of the impurity in said step (2) is carried out in order to form all the MISFET's constituting said memory cells into depletion-mode MISFET's, and the introduction of the impurity in said step (5) is carried out in order to form some of the depletion-mode MISFET's formed in said step (2) into enhancement-mode MISFET's.

25. A process according to claim 20, wherein said gate electrodes of said n-channel MISFET's are made of polycide.

26. A process according to claim 20, wherein said impurity of the first conductivity type is introduced into a channel region of the selected at least one MISFET, in step (5), so as to write data into the memory cells.

27. A process for producing a semiconductor device having a read-only memory, said read-only memory including a plurality of memory cells, each of which is comprised of n-channel MISFET's and which are connected in series to form rows of memory cells, said process comprising the steps of:

(1) providing a semiconductor substrate having a principal surface, at least the principal surface, of said substrate, having a P-type conductivity, the principal surface of the substrate having a field insulator film thereon, said field insulator film defining a region in which memory cells are to be formed;

(2) implanting an impurity of N-type conductivity into said principal surface in the region in which memory cells are to be formed, whereby the whole surface of the region in which memory cells are to be formed has the impurity of N-type conductivity implanted therein;

(3) after said implanting the impurity of the N-type conductivity, forming a plurality of the MISFET's in said region, said plurality of the MISFET's having gate electrodes; and (4) implanting boron ions into the channel region of at least one MISFET selected from said plurality of the MISFET's, such that the selected at least one MISFET operates at a second operating potential of about 5 volts and does not operate at a first operating potential of about zero volts, wherein remaining MISFET's, other than the selected MISFET's, operate at a first operating potential of about zero volts.

28. A process according to claim 27, wherein, after forming the plurality of MISFET's, an aluminum wiring layer is provided thereover, and wherein the implanting of the boron ions is performed through the aluminum wiring layer.

29. A process according to claim 27, wherein said gate electrodes of the plurality of MISFET's are formed after said implanting the impurity of N-type conductivity into said principal surface in the region in which memory cells are to be formed.

* * * * *